United States Patent
Kiyokawa et al.

(10) Patent No.: US 8,299,935 B2
(45) Date of Patent: Oct. 30, 2012

(54) TEST APPARATUS AND TEST METHOD

(75) Inventors: Toshiyuki Kiyokawa, Saitama (JP); Toshikazu Okawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 151 days.

(21) Appl. No.: 12/857,488

(22) Filed: Aug. 16, 2010

(65) Prior Publication Data
US 2011/0298630 A1    Dec. 8, 2011

Related U.S. Application Data

(63) Continuation of application No. PCT/JP2009/003822, filed on Aug. 7, 2009.

(51) Int. Cl.
*G08B 21/00* (2006.01)
(52) U.S. Cl. .................... 340/686.1; 324/555
(58) Field of Classification Search ............. 340/686.1; 73/863.91; 324/537, 555, 754, 73.1, 756.03, 324/750.03
See application file for complete search history.

(56) References Cited

U.S. PATENT DOCUMENTS

| | | | |
|---|---|---|---|
| 7,340,364 B1 * | 3/2008 | Kumaki | 702/118 |
| 7,502,708 B2 * | 3/2009 | Kumaki | 702/123 |
| 2004/0092069 A1 | 5/2004 | Ishii | |
| 2004/0234362 A1 | 11/2004 | Iijima et al. | |
| 2005/0271400 A1 | 12/2005 | Okamoto et al. | |
| 2005/0279281 A1 | 12/2005 | Yamashita et al. | |
| 2008/0038098 A1 | 2/2008 | Ito et al. | |
| 2008/0042667 A1 | 2/2008 | Yamashita et al. | |
| 2010/0148793 A1 | 6/2010 | Ito et al. | |
| 2010/0156434 A1 | 6/2010 | Okino | |

FOREIGN PATENT DOCUMENTS

| | | |
|---|---|---|
| JP | H02-037738 A | 2/1990 |
| JP | 2001-345257 A | 12/2001 |

(Continued)

OTHER PUBLICATIONS

International Search Report (ISR) issued in PCT/JP2009/003822 (parent application) mailed on Oct. 2009 for Examiner consideration citing U.S. Patent Application Publication Nos. 4-5 and Foreign Patent document Nos. 7-11 listed above.

(Continued)

*Primary Examiner* — Toan N Pham
(74) *Attorney, Agent, or Firm* — Chen Yoshimura LLP

(57) ABSTRACT

A test apparatus comprising a plurality of test units that test a device under test; a plurality of housing sections that respectively house the test units therein; a plurality of opening/closing sections that are disposed respectively in the housing sections and that expose the test units to the outside or isolate the test units from the outside; and a control section that independently controls whether each of the opening/closing sections is allowed to be opened. The control section may allow test units that are not supplied with power to be exposed to the outside. For at least one of (i) a period during which one of the test units is performing a predetermined operation, (ii) a predetermined period before the period during which one of the test units is performing the predetermined operation, and (iii) a predetermined period after the period during which one of the test units is performing the predetermined operation, the control section may prohibit other test units from being exposed to the outside.

20 Claims, 7 Drawing Sheets

FOREIGN PATENT DOCUMENTS

| | | | |
|---|---|---|---|
| JP | 2002-280279 A | | 9/2002 |
| JP | 2003-197711 A | | 7/2003 |
| JP | 2004-145083 A | | 5/2004 |
| JP | 2004-163194 A | | 6/2004 |
| JP | 2005-346013 A | | 12/2005 |
| JP | 2006-012912 A | | 1/2006 |
| JP | 2006012912 A | * | 1/2006 |
| WO | 2006/009253 A1 | | 1/2006 |
| WO | 2006/009282 A1 | | 1/2006 |
| WO | 2009/004968 A1 | | 1/2009 |

OTHER PUBLICATIONS

Written Opinion (PCT/ISA/237) issued in PCT/JP2009/003822 (parent application) mailed in Oct. 2009. Concise Explanation of Relevance: This Written Opinion considers that the some of claims are described by or obvious over the U.S. Patent Application Publication Nos. 4-5 and Foreign Patent document Nos. 7-11 cited in ISR above.
English translation of Written Opinion (PCT/ISA/237) issued in PCT/JP2009/003822 mailed in Mar. 2012. (Japanese Written Opinion and cited references have been submitted in a previous IDS.).

* cited by examiner

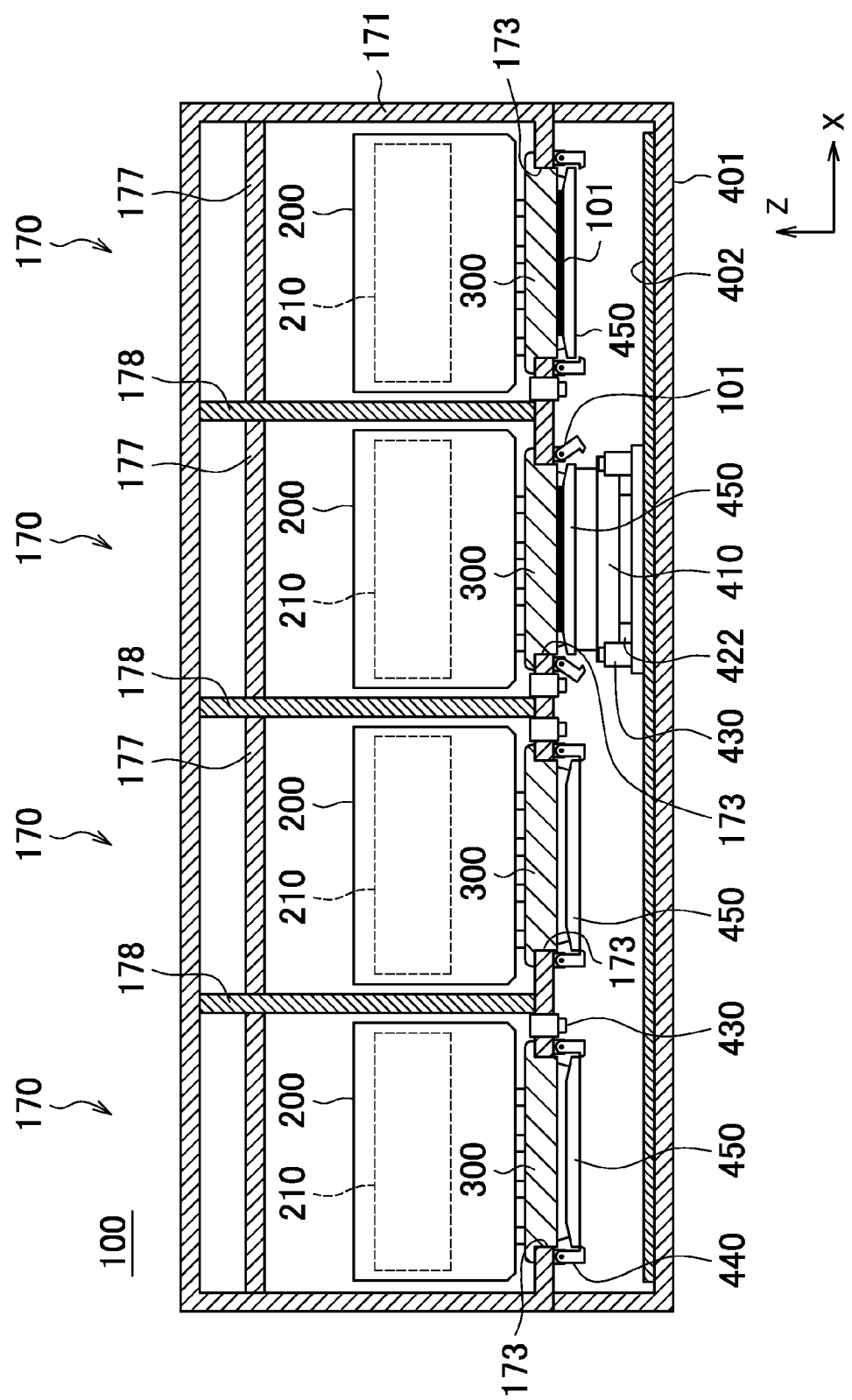
F I G . 4

TEST APPARATUS AND TEST METHOD

BACKGROUND

1. Technical Field

The present invention relates to a test apparatus and a test method.

2. Related Art

An electronic component test apparatus provided with a plurality of test units is desired that can perform maintenance on a portion of the test units without stopping the entire system of the electronic test apparatus, by using transmission paths that bypass a portion of the test units.

Patent Documents 1 to 6 disclose means for achieving this objective by bypassing a portion of the test units and changing testing schedules.

Patent Document 1: International Publication WO 2006/009282
Patent Document 2: International Publication WO 2006/009253
Patent Document 3: Japanese Patent Application Publication No. 2003-197711
Patent Document 4: Japanese Patent Application Publication No. H02-037738
Patent Document 5: Japanese Patent Application Publication No. 2004-163194
Patent Document 6: Japanese Patent No. 3605544

When performing maintenance on a portion of the test units, if the person performing maintenance makes an error and begins performing maintenance on test units that are being used for testing, there is a possibility that the electronic component will be damaged. Furthermore, when maintenance is performed on a portion of the test units while other test units are performing testing, there is a possibility that mechanical vibration caused by the maintenance will affect other tests performed by the test apparatus.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus comprising a plurality of test units that test a device under test; a plurality of housing sections that respectively house the test units therein; a plurality of opening/closing sections that are disposed respectively in the housing sections and that expose the test units to the outside or isolate the test units from the outside; and a control section that independently controls whether each of the opening/closing sections is allowed to be opened.

In the test apparatus the control section may allow test units that are not supplied with power to be exposed to the outside. For at least one of (i) a period during which one of the test units is performing a predetermined operation, (ii) a predetermined period before the period during which one of the test units is performing the predetermined operation, and (iii) a predetermined period after the period during which one of the test units is performing the predetermined operation, the control section may prohibit other test units from being exposed to the outside. The predetermined operation may be an operation that causes (i) a test head that tests an electrical characteristic of the device under test to contact (ii) a probe card that is interposed between the test head and the device under test and that is electrically connected to the device under test and the test head.

The test apparatus may further comprise a warning section that issues a warning when one of the opening/closing sections exposes the corresponding test unit to the outside while one of the test units is attempting to perform a predetermined operation. In the test apparatus, when one of the opening/closing sections exposes the corresponding test unit to the outside while one of the test units is attempting to perform a predetermined operation, the control section may prohibit performance of the predetermined operation. The test apparatus may further comprise a first selecting section that enables a user to select, from among the test units, a test unit to be exposed to the outside; and a second selecting section that enables a user to reselect, from among the test units, the test unit to be exposed to the outside, and the control section may allow the test unit selected via the first selecting section to be exposed to the outside if the test unit selected via the first selecting section matches the test unit selected via the second selecting section.

The test apparatus may further comprise a first selecting section that enables a user to select, from among the test units, a test unit to be exposed to the outside; and a second selecting section that enables a user to reselect, from among the test units, the test unit to be exposed to the outside, and the control section may stop a supply of power to the test unit selected via the first selecting section if the test unit selected via the first selecting section matches the test unit selected via the second selecting section. The test apparatus may further comprise a chassis that houses the test units therein; and a partitioning member that forms the plurality of housing sections by dividing the chassis. In the test apparatus each of the housing sections may include a temperature adjusting section that operates independently.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 shows a partial vertical cross section of the alignment unit 400 and the test units 170.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
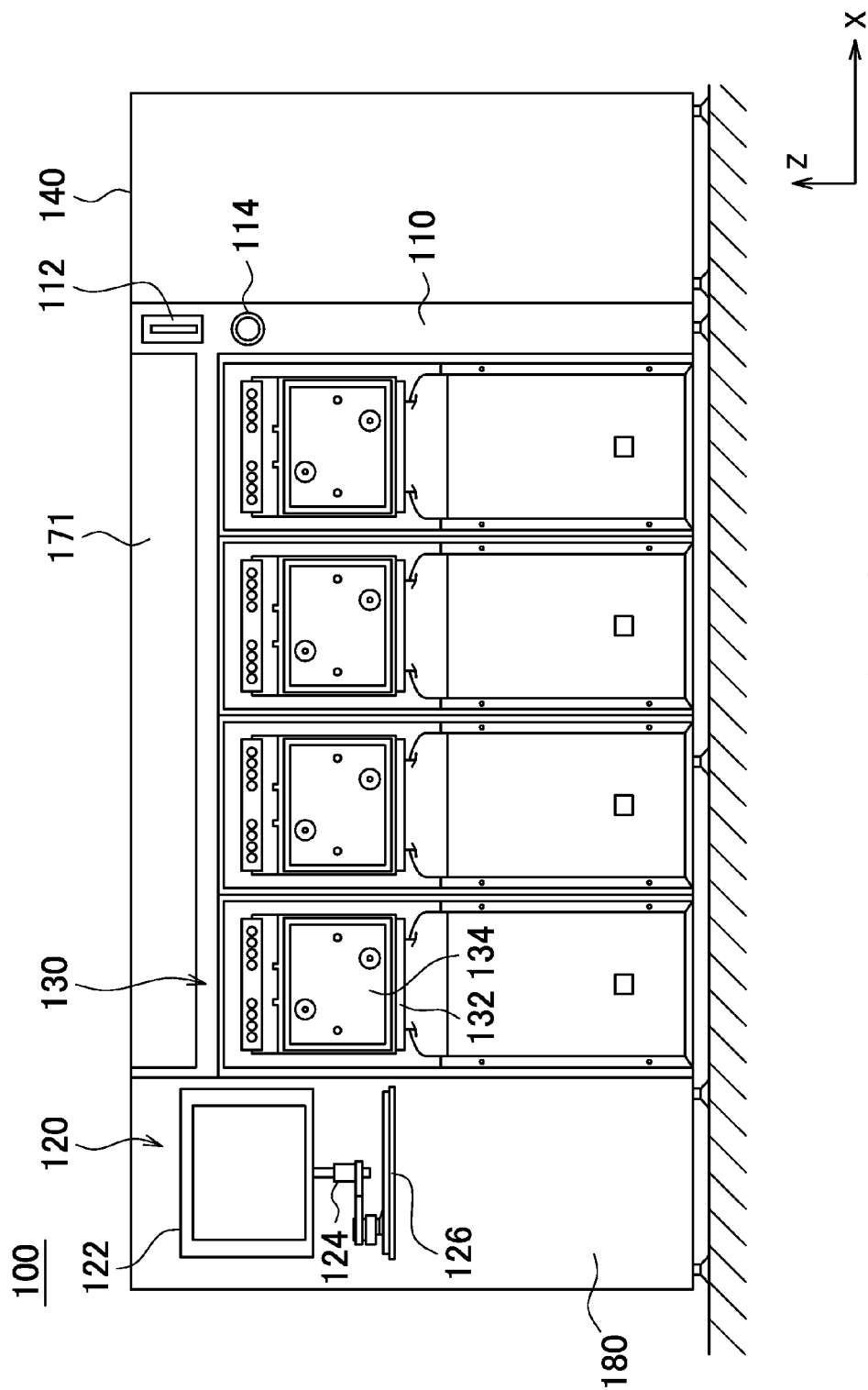
FIG. 1 shows a front view of an exemplary test apparatus 100.

FIG. 1 shows a schematic front view of an exemplary test apparatus 100. The test apparatus 100 includes an EFEM 110, an operating section 120, load units 130, a cooling unit 140, and a power unit 180. The test apparatus 100 also includes a chassis 171 that houses a plurality of test units therein. The test apparatus 100 may test electrical characteristics of chips formed on a semiconductor wafer to judge the acceptability of a device under test. The semiconductor wafer and the chips are examples of a device under test.

The EFEM 110 houses a mechanism for transporting a substrate of the semiconductor wafer or the like serving as a test target within the test apparatus 100. The EFEM 110 is an example of a transporting section that transports the device under test. In the present embodiment, the EFEM 110 has the greatest dimensions within the test apparatus 100, and so a signal lamp 112 indicating the operational state of the test apparatus 100 and an EMO 114 that operates when the test apparatus 100 stops unexpectedly are arranged at a high position on the front surface of the EFEM 110.

The operating section 120 is supported by the EFEM 110. The operating section 120 includes a display 122, an arm 124, and an input apparatus 126. One end of the arm 124 is coupled to the EFEM 110, and the other end supports the display 122 and the input apparatus 126 in a manner to be freely movable.

The display 122 includes a liquid crystal display device or a touch panel display, and displays the operational state of the test apparatus 100, echo back of input content from the input apparatus 126, and a warning to a user, for example. The display 122 is an example of a warning section.

The input apparatus 126 may include a keyboard, a mouse, a tracking ball, a jog wheel, and a touch panel display, for example, and receives instructions relating to settings or operations of the test apparatus 100. The input apparatus 126 may receive instructions ordering the initiation of maintenance of the test apparatus 100 and instructions relating to locations where maintenance is to be performed. The input apparatus 126 is an example of a first selecting section or a second selecting section. These instructions may be input to the test apparatus 100 from another computer via a communication line.

The load units each 130 include a load table 132 and a load gate 134. A container housing the semiconductor wafer, which serves as the test target, is placed on the load table 132. The load gate 134 opens and closes when the semiconductor wafer is transported to and from the test apparatus 100. As a result, the semiconductor wafer can be loaded from the outside without decreasing the cleanliness inside the test apparatus 100.

The cooling unit 140 may cool a wafer that is heated by testing in the test apparatus 100, prior to transportation of the wafer. Transportation of the wafer to and from the cooling unit 140 can be achieved using the EFEM 110, for example. The cooling unit 140 may adjust the temperature of cold water and supply this cold water to air-conditioning equipment that controls the temperature within the test apparatus 100. The cooling unit 140 may be arranged adjacent to the EFEM 110, or may be arranged between the load units 130 and the test heads that execute the testing. The power unit 180 supplies power to each component of the test apparatus 100.

Figure 2:
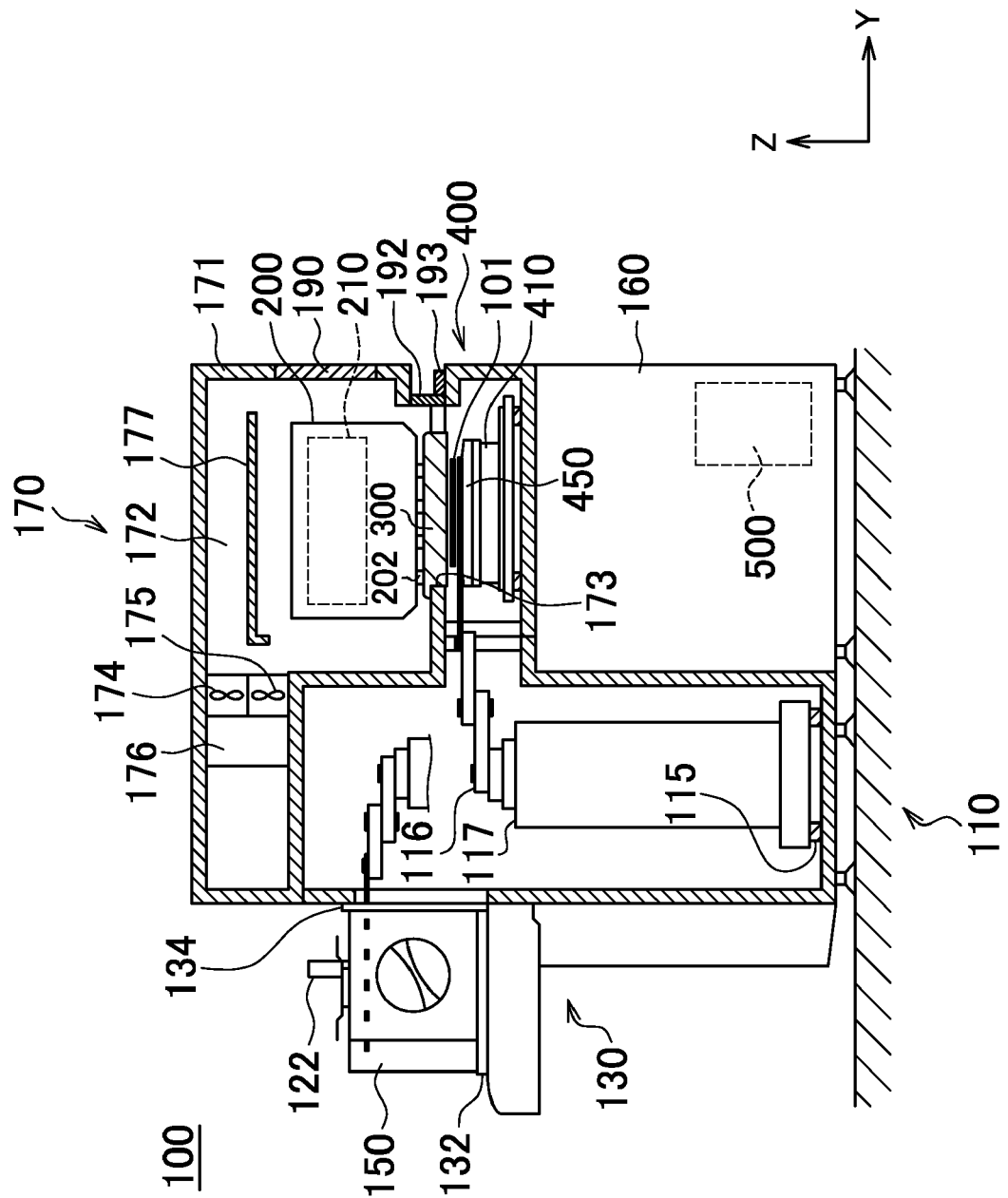
FIG. 2 shows a partial vertical cross section of the test apparatus 100.

FIG. 2 is a schematic view of a partial vertical cross section of the test apparatus 100. Components that are the same as those in FIG. 1 are given the same reference numerals and redundant descriptions are omitted. The test apparatus 100 includes an EFEM 110, a load unit 130, a mainframe 160, test units 170, and an alignment unit 400. In FIG. 2, the cooling unit 140 is not shown.

In the present embodiment, the load unit 130, the EFEM 110, and the mainframe 160 are arranged adjacently in the stated order from front to back, which is from the left side to the right side of FIG. 2. The test units 170 and the alignment unit 400 are arranged on the mainframe 160 in the stated order. The load unit 130 and the alignment unit 400 are connected to the EFEM 110 in such a manner as to be air-tight with respect to the outside, and a high level of cleanliness is maintained in each of these units. The insides of the test units 170 and the alignment unit 400 are connected to each other.

In FIG. 2, a FOUP 150 is placed on the load table 132 of a load unit 130. The FOUP 150 houses a plurality of wafers 101 serving as test targets. The FOUP 150 also stores wafers 101 if the wafers 101 are collected after testing.

The EFEM 110 houses the robotic arm 116. The robotic arm 116 is loaded on a column 117 that runs along a rail 115, and transfers the wafers between the load unit 130 and the alignment unit 400. The robotic arm 116 takes the wafers 101 one at a time from the FOUP 150 through the load gate 134, and transports the wafers 101 to the alignment unit 400.

The mainframe 160 controls the overall operation of the test apparatus 100. For example, the mainframe 160 may be connected to the operating section 120 and reflect the input received by the input apparatus 126 of the operating section 120 in each section of the test apparatus 100. The mainframe 160 generates display content that reflects the operational state of the test apparatus 100 and displays this content in the display 122 of the operating section 120.

The mainframe 160 may be a system that controls the operation of each section in the test apparatus 100. For example, the mainframe 160 may include a control system 500 that controls the operation of the test units 170. The control system 500 stores a test program, for example, and controls the operation of the test units 170 according to the test program.

The mainframe 160 may synchronize operation of the load unit 130, the EFEM 110, the test units 170, and the alignment unit 400 to pass the wafers 101 therebetween and test these wafers 101. When the EMO 114 is operated, the mainframe 160 immediately stops the operation of each section of the test apparatus 100.

Each test unit 170 tests a device under test. Each test unit 170 includes a test head 200 and a probe card 300. In the present embodiment, the test apparatus 100 includes a plurality of test units 170. The test apparatus 100 also includes a chassis 171 that houses the test units 170 therein and that includes a plurality of housing chambers 172. The housing chambers 172 respectively store the test units 170 therein. The test units 170 are examples of test units. The housing chambers 172 are examples of housing sections.

In the present embodiment, each housing chamber 172 is provided with an opening 173, a rear door 190, and a maintenance cover 192. Furthermore, a guide rail 193 is provided on the outside of the maintenance cover 192 to support the probe card 300 when the probe card 300 is pulled. The opening 173 is formed in the bottom surface of each housing chamber 172 of the chassis 171, and each housing chamber 172 is communicatively connected to the alignment unit 400 via the opening 173.

The rear door 190 and the maintenance cover 192 are provided on a back surface of each housing chamber 172 of the chassis 171, thereby enabling the test units 170 to be exposed to or isolated from the outside. The rear doors 190 are arranged at positions that allow for easy maintenance of the test heads 200, and the maintenance covers 192 are arranged at positions that allow for easy maintenance of the probe cards 300.

The probe cards 300 are supported on the peripheries of the openings 173, but the maintenance covers 192 can be opened so that the probe cards 300 can be pulled outside from the back surfaces of the maintenance covers 192. The rear doors 190 and maintenance covers 192 are examples of opening/closing sections.

Each housing chamber 172 includes a suction fan 174, an exhaust fan 175, a temperature adjusting unit 176, and an air-conditioning dividing member 177 therein. The suction fan 174 draws gas into the housing chamber 172 via the temperature adjusting unit 176. The exhaust fan 175 expels gas within the housing chamber 172 to the outside via the temperature adjusting unit 176.

The temperature adjusting unit 176 adjusts the temperature of the gas expelled from the exhaust fan or the gas drawn in by the suction fan 174. The temperature adjusting unit 176 may include at least one of a cooling device and a heating device. The temperature adjusting unit may be a heat exchanger that uses cooled water made in the cooling unit 140.

Since each housing chamber 172 includes an air-conditioning dividing member 177 therein, the gas drawn in by the suction fan 174 circulates within the housing chamber 172 and is then expelled by the exhaust fan 175. The suction fan 174 and exhaust fan 175 in each housing chamber 172 may be oriented in the height direction of the test apparatus 100, which is referred to as the z direction hereinafter, and the height at which the air-conditioning dividing member 177 is positioned may be set to be between the height of the suction fan 174 and the height of the exhaust fan 175. Furthermore, the air-conditioning dividing member 177 may be arranged above the test head 200. As a result, the temperature of the test head 200 can be efficiently adjusted.

A suction fan 174, an exhaust fan 175, and a temperature adjusting unit 176 may be arranged in each housing chamber 172. Suction fans 174, exhaust fans 175, and temperature adjusting units 176 arranged in different housing chambers 172 may operate independently of each other. As a result, the temperature of each housing chamber 172 can be independently controlled.

A single temperature adjusting unit 176 may be shared by a plurality of housing chambers 172. In this case as well, the temperature of each housing chamber 172 can be independently controlled by controlling the suction fan 174 and the exhaust fan 175 arranged in each housing chamber 172. The suction fans 174, exhaust fans 175, and temperature adjusting units 176 are examples of temperature adjusting sections.

The test head 200 is electrically connected to a wafer 101 and tests electrical characteristics of the wafer 101. The test head 200 may perform a plurality of tests that involve different temperatures on the device under test. The test head 200 houses a plurality of pin electronics 210. The pin electronics 210 each include an electrical circuit according to the content of a test and the test target. In the present embodiment, each test head 200 is electrically connected to the probe card 300 via a contactor 202 mounted on the bottom surface of the test head 200.

The probe card 300 may be a circuit board that is inserted between the test head 200 and the wafer 101 to provide an electrical connection therebetween when the test apparatus 100 is performing a test. When testing a wafer 101, the probe card 300 is used to form an electrical signal path between the test head 200 and the wafer 101. By replacing the probe card 300, the test apparatus 100 can be adapted to wafers 101 with different layouts.

The alignment unit 400 includes an alignment stage 410. The alignment stage 410 has the wafer tray 450 and the wafer 101 loaded thereon, and runs along a rail. The alignment stage 410 can extend and contract in the z direction to raise and lower a wafer 101 that is loaded thereon. As a result, after the wafer 101 is aligned with the probe card 300, the wafer 101 can be pressed by the probe card 300 thereabove.

Figure 3:
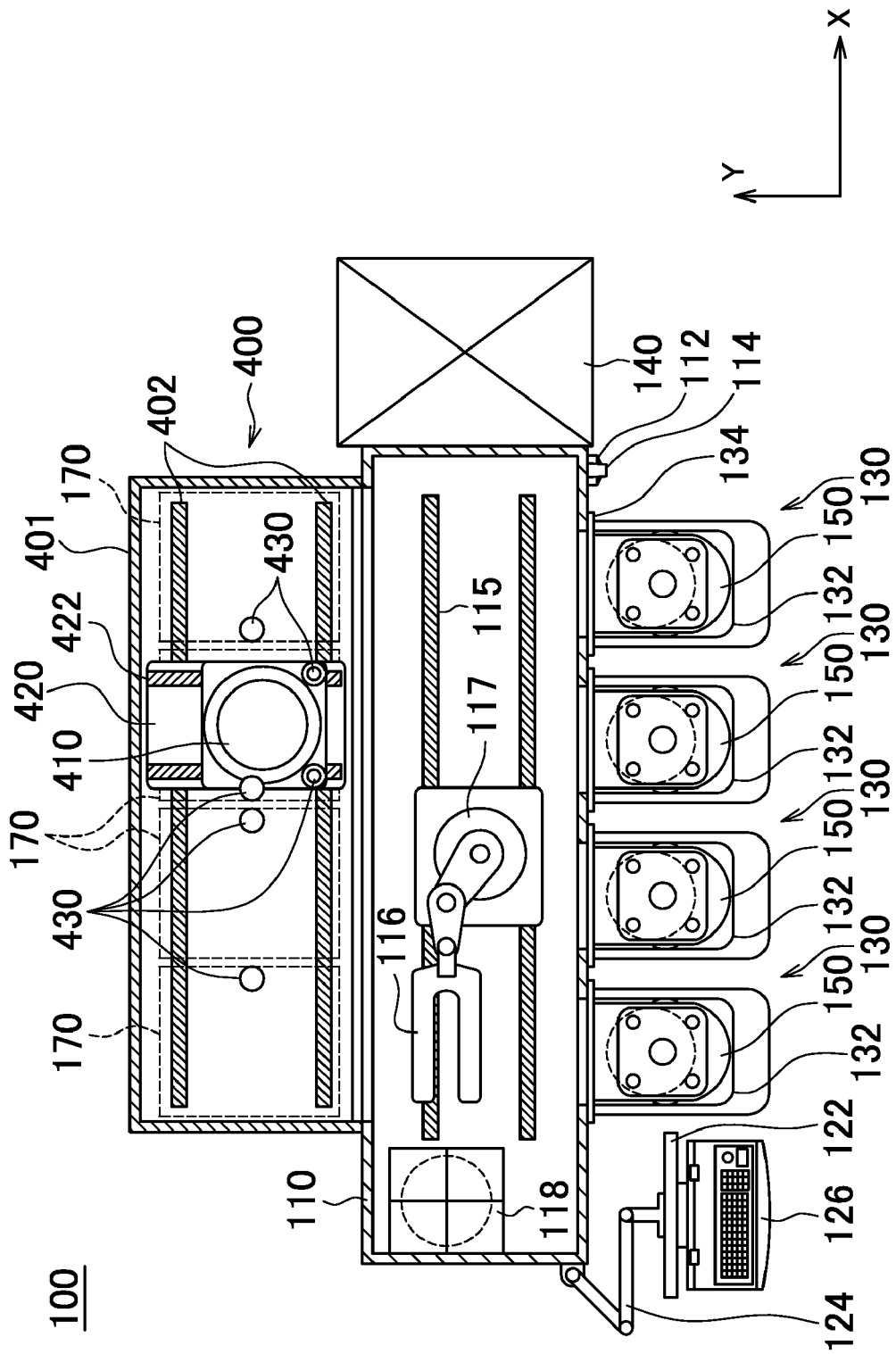
FIG. 3 shows a partial horizontal cross section of the test apparatus 100.

FIG. 3 is a schematic view of a partial horizontal cross section of the test apparatus 100. Components that are the same as those in FIGS. 1 and 2 are given the same reference numerals and redundant descriptions are omitted. The test apparatus 100 includes four load units 130 and four test units 170. Each load unit 130 has a FOUP 150 loaded thereon. One EFEM 110 and one alignment unit 400 are provided. The alignment unit 400 includes a single alignment stage 410. The test units 170 are positioned above the cross-sectional plane shown in FIG. 3, and are therefore represented by dotted lines. In FIG. 3, the power unit 180 is not shown.

In the EFEM 110, the column 117 supporting the robotic arm 116 moves across substantially the entire width of the EFEM 110 along the rail 115. Accordingly, the robotic arm 116 can transport the wafer 101 to all of the four load units 130 and the four test units 170.

A pre-aligner 118 is arranged within the EFEM 110 on a side opposite the cooling unit 140. The pre-aligner 118 adjusts the loading position of the wafer 101 relative to the robotic arm 116, with an accuracy that is less than that required for the test head 200 but still relatively high. As a result, the initial positioning accuracy when the robotic arm 116 loads the wafer 101 onto the wafer tray 450 is improved, and the time necessary for alignment with the probe card 300 is decreased. Furthermore, the throughput of the test apparatus 100 is increased.

The alignment unit 400 includes rails 402, rails 422, a stage carrier 420, an alignment stage 410, and microscopes 430. The rails 402 are arranged across substantially the entire width of the bottom surface of a chassis 401. The stage carrier 420 moves along the rails 402 in a direction of the width of the chassis 401, which is refereed to hereinafter as the x direction. Therefore, the alignment stage 410 has the wafer tray 450 and the wafer 101 loaded thereon, and runs along the rails 402.

The stage carrier 420 includes the rails 422 on the top surface thereof that run parallel to the rails 402 of the chassis 401. As a result, the alignment stage 410 moves above the rails 422 in the direction of the depth of the chassis 401, which is referred to hereinafter as the y direction.

A portion of the microscopes 430 correspond to the test heads 200 and are arranged near corresponding probe cards 300. These microscopes 430 are arranged on the ceiling of the chassis 401 to face downward.

A pair of microscopes 430 are loaded on the stage carrier 420 along with the alignment stage 410, and move together with the alignment stage 410. The pair of microscopes 430 are arranged to face upward. The pair of microscopes 430 may be distanced from each other in the x direction.

The wafer 101 on the alignment stage 410 can be aligned with the probe card 300 using these microscopes 430. Specifically, the position of the wafer 101 when loaded onto the alignment stage 410 can be set with a prealignment accuracy. The position of the wafer 101 can be accurately detected by using the downward-facing microscopes 430 to detect the edge of the wafer 101, for example.

The relative positions of the microscopes 430 arranged on the chassis 401 with respect to the probe card 300 are already known. Therefore, the wafer 101 and the probe card 300 can be aligned by detecting the difference between the position of the wafer 101 and the position of the probe card 300 and moving the alignment stage 410 to compensate for this difference. Detection of the position of the wafer 101 is not limited to detecting the position of the edge. For example, an image from the microscopes 430 may be displayed on the display 122, and the alignment may be performed manually.

FIG. 4 is a schematic view of a partial vertical cross section of the alignment unit 400 and the test units 170. Components that are the same as those in FIGS. 1 to 3 are given the same reference numerals and redundant descriptions are omitted. In FIG. 4, the mainframe 160 is not shown. A plurality of chassis partitioning members 178 are formed in the chassis 171 to divide the chassis 171 and create the plurality of housing chambers 172. The chassis partitioning members 178 are examples of partitioning components. The alignment unit 400 includes the chassis 401, the alignment stage 410, and a hanger hook 440.

The chassis 401 has a width according to a plurality of test heads 200, in this case four test heads 200. The chassis 401 is communicatively connected to the housing chambers 172 via the openings 173 on the top surface thereof. Four probe cards 300 corresponding respectively to the test heads 200 are mounted on the top surface of the chassis 401. Furthermore, hanger hooks 440 that open and close are arranged on the ceiling within the chassis 401 at positions corresponding respectively to the test heads 200.

The alignment stage 410 moves below the test heads 200 along the rails 402 arranged on the bottom surface in the chassis 401. The alignment stage 410 can extend and contract in the z direction to raise and lower a wafer tray 450 that is loaded thereon.

When the hanger hooks 440 are closed, the wafer trays 450 hang thereon to be held immediately below the probe cards 300. Therefore, the alignment unit 400 can have a wafer tray 450 waiting immediately below each set of a test head 200 and a probe card 300. When the hanger hooks 440 open, the wafer trays 450 are released.

In the alignment unit 400, each wafer tray 450 held by hanger hooks 440 is loaded onto the alignment stage 410 that rises up from below. Next, the hanger hooks 440 open and the alignment stage 410 drops, thereby releasing the wafer tray 450 from the hanger hooks 440.

Next, the robotic arm 116 of the EFEM 110 loads the wafer 101 onto the wafer tray 450 whose top surface was released by the drop of the alignment stage 410. In this way, the alignment stage 410 can have the wafer 101, which is placed on the wafer tray 450, loaded thereon.

Next, the alignment stage 410 aligns the wafer 101 with the probe card 300 while raising the wafer tray 450, thereby pressing the wafer 101 against the bottom surface of the probe card 300. In this state, the probe card 300, the wafer 101, and the wafer tray 450 are formed integrally.

For example, the probe card 300, the wafer 101, and the wafer tray 450 can be formed integrally by sandwiching the wafer 101 between the probe card 300 and the wafer tray 450 and reducing pressure between the probe card 300 and the wafer tray 450. Another possible method involves using a fixing jig to sandwich the probe card 300 and the wafer tray 450 from the outside while the wafer 101 is therebetween.

After this, the alignment stage 410 moves while leaving behind the wafer 101 and the wafer tray 450. Since the probe card 300, the wafer 101, and the wafer tray 450 are formed integrally, the wafer 101 and the wafer tray 450 do not fall even though the alignment stage 410 is no longer there.

As a result, the wafer 101 can be mounted on the test head 200. While this test head 200 tests the wafer 101, the alignment stage 410 can transport another wafer 101 to another test head 200. If the wafers 101 are to be collected after testing is finished, the series of operations described above are then performed in reverse. As a result, the wafer 101 can be transported by the robotic arm 116. At this time, the wafer tray 450 waits immediately below the test head 200.

In the example of FIG. 4, in the test unit 170 on the right end, the wafer tray 450 and the wafer 101 are formed integrally with the probe card 300 immediately below the test head 200. At this time, the hanger hooks 440 are closed, but do not contact the wafer tray 450. Furthermore, immediately below the test head 200 of the test unit 170 that is second from the right in FIG. 4, the alignment stage 410 is pushing up on the wafer tray 450 and the wafer 101 loaded thereon to attach the wafer 101 to the probe card 300. In the other test units 170, the hanger hooks 440 are holding the wafer trays 450 in a waiting position.

In this way, wafer trays 450 corresponding respectively to four test units 170 are loaded in the alignment unit 400. As a result, each test unit 170 can individually test a wafer 101. The plurality of test units 170 may perform the same type of test, or may each perform a different test. If the test units 170 perform different tests, the throughput of the test apparatus 100 can be improved by allocating a test that requires a large amount of time to a plurality of test units 170.

In this way, in the test apparatus 100, a single alignment stage 410 and a single robotic arm 116 can be shared by a plurality of test units 170. As a result, the usage efficiency of the alignment stage 410 and the robotic arm 116 can be improved.

Figure 5:
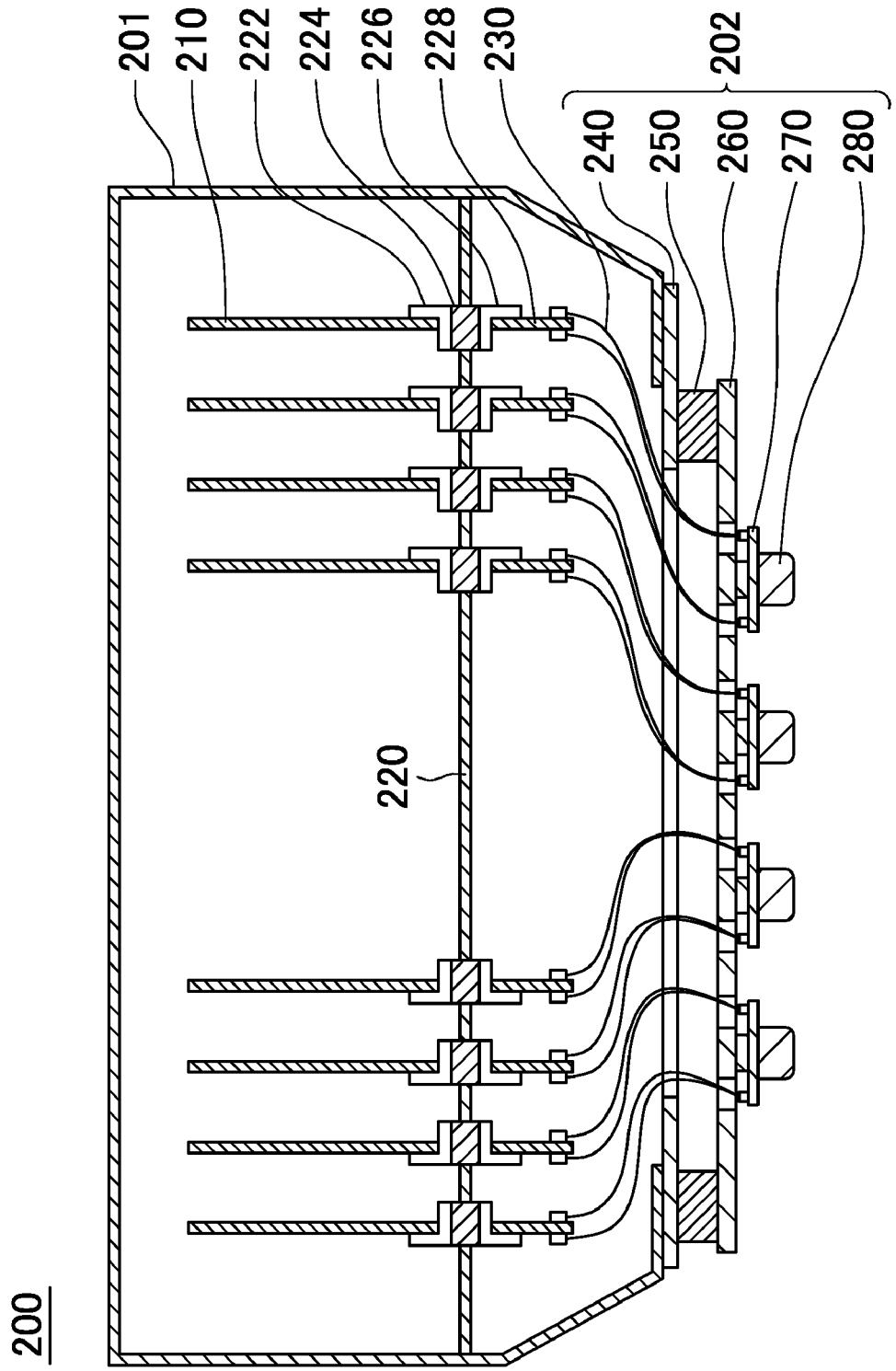
FIG. 5 shows a cross section of a test head 200.

FIG. 5 is a cross-sectional view of a test head 200. Components that are the same as those in FIGS. 1 to 4 are given the same reference numerals and redundant descriptions are omitted. The test head 200 includes a chassis 201, a contactor 202, pin electronics 210, a motherboard 220, and flat cables 230.

The motherboard 220 includes a plurality of relay connectors 224 and is oriented horizontally within the chassis 201. The relay connectors 224 each include receptacles on the top surface side and the bottom surface side of the motherboard 220, and form signal paths passing through the motherboard 220.

On the top surface of the motherboard 220, the pin electronics 210 are mounted on the relay connectors 224 via angle connectors 222. With this configuration, the pin electronics 210 can be replaced according to the testing content and the specifications of the test target. The pin electronics 210 may have the same specifications as each other or may have different specifications. Furthermore, pin electronics 210 need not be mounted on some of the relay connectors 224.

On the bottom surface of the motherboard 220, small substrates 228 are connected to the relay connectors 224 via angle connectors 226. One end of each flat cable 230 is connected to a corresponding small substrate 228. As a result, the pin electronics 210 inside the chassis 201 and the contactor 202 can be connected to each other via the flat cables 230.

The contactor 202 is mounted on the bottom surface of the chassis 201. The contactor 202 includes a support substrate 240, three-dimensional actuators 250, a contactor substrate 260, sub-substrates 270, and contactor housings 280.

The top surface of the support substrate 240 is fixed to the chassis 201, and the bottom surface of the support substrate 240 supports top ends of the three-dimensional actuators 250. The bottom ends of the three-dimensional actuators 250 support the contactor substrate 260. The sub-substrates 270 and the contactor housings 280 are fixed on the bottom surface of the contactor substrate 260.

The three-dimensional actuators 250 extend and contract vertically, and can move horizontally along the bottom surface of the support substrate 240. As a result, the contactor substrate 260 can move three-dimensionally. When the contactor substrate 260 moves, the sub-substrates 270 and the contactor housings 280 move along with the contactor substrate 260.

The bottom ends of the flat cables 230 are connected to terminals held by the contactor housings 280, such as spring pins. As a result, the pin electronics 210 are electrically connected down to the bottommost surface of the test head 200. Spring pins are given as an example of the terminals here, but configurations that use capacitance coupling or optical coupling, for example, may be adopted instead of using the spring pins.

Figure 6:
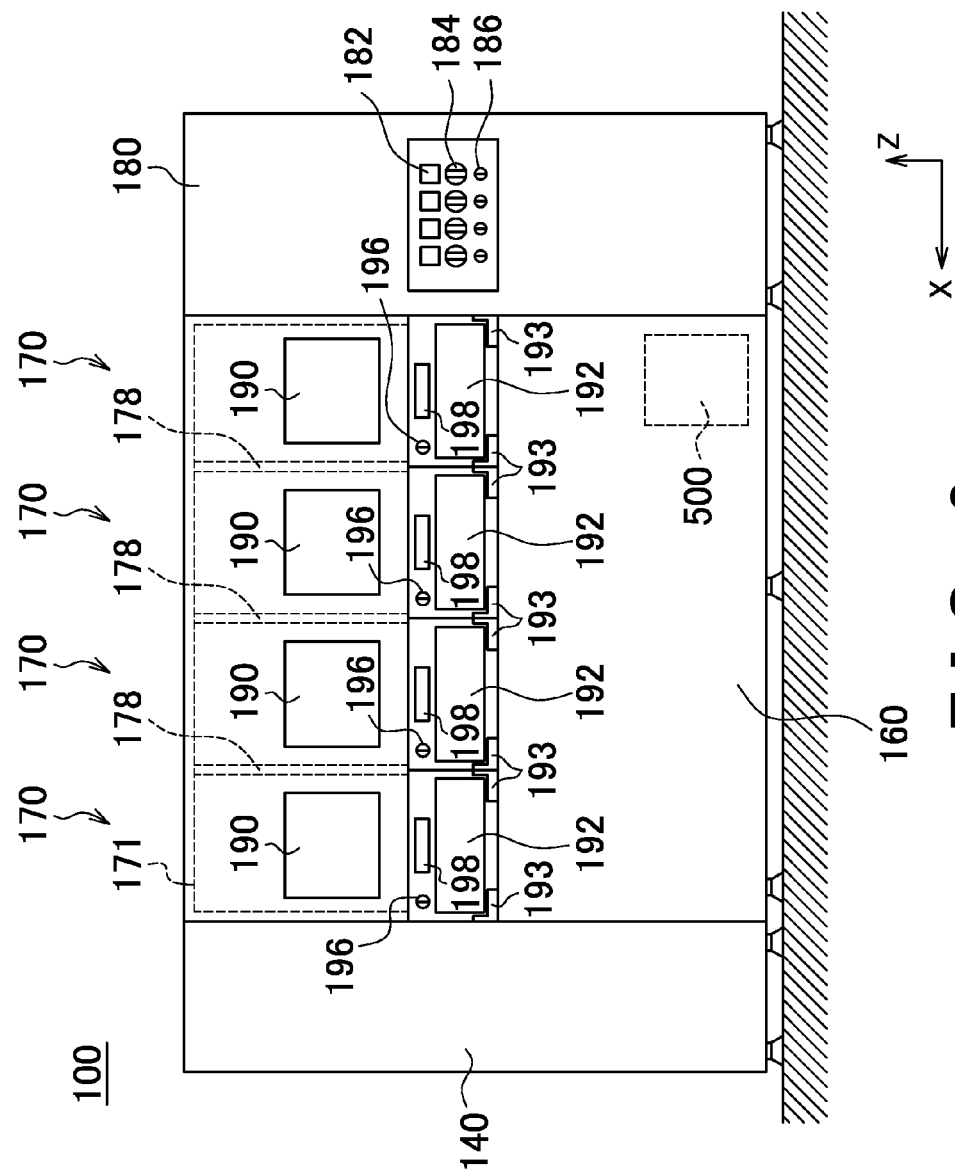
FIG. 6 shows a rear view of an exemplary test apparatus 100.

FIG. 6 shows a schematic rear view of an exemplary test apparatus 100. Components that are the same as those in FIGS. 1 to 5 are given the same reference numerals and redundant descriptions are omitted. The power unit 180 includes a plurality of lamps 182, power switches 184, and mode switches 186 corresponding respectively to the test units 170. The test apparatus 100 includes a plurality of rear doors 190, maintenance covers 192, guide rails 193, locking sections 196, and warning display sections 198 corresponding respectively to the housing chambers 172.

The mainframe 160 includes the control system 500. The control system 500 controls the operation of the test units 170 and also independently controls whether the rear door 190 and the maintenance cover 192 are open or closed for each housing chamber 172 or test unit 170. In this way, the control system 500 can independently control whether each test unit 170 is exposed to or isolated from the outside, and can therefore prevent unintentional opening of rear doors 190 or maintenance covers 192 corresponding to test units 170 that are not allowed to be exposed to the outside.

For example, the control system 500 may allow test units 170 that are not being supplied with power, from among the plurality of test units 170, to be exposed to the outside. In other words, the control system 500 may determine whether one of the test units 170 testing a device under test is to be exposed to the outside, and then allow the test unit 170 that has been thusly judged to be exposed to the outside. In this way, the control system 500 can prevent damage to a wafer 101 under test caused by opening a test unit 170 performing testing to the outside.

As another example, during a period in which one of the test units 170 is performing a predetermined operation, or during a period before or after this period, the control system 500 may prohibit the opening of other test units 170 to the outside. In other words, when determining whether a test unit 170 is to be exposed to the outside, during a period in which the test units 170 that are not undergoing this determination are performing a predetermined operation or during a prescribed period before or after this period, the control system 500 may prohibit the test unit 170 that underwent the above determination from being exposed to the outside. Furthermore, when a rear door 190 or a maintenance cover 192 of a housing chamber 172 exposes the test unit 170 stored in the housing chamber 172 to the outside while other test units 170 are attempting to perform a predetermined operation, the control system 500 may prohibit the performance of this predetermined operation.

The predetermined operation may be an operation that is easily affected by mechanical vibration or a change in voltage, such as attaching a test head 200 to a probe card 300 or aligning the wafer 101 with the probe card 300. As a result, when a test unit 170 is performing an operation that is easily affected by mechanical vibration or a change in voltage, for example, initiation of maintenance of other test units 170 causing mechanical vibration or a voltage change can be prevented. The control system 500 may store in advance information relating to the types of operations for which the above effects are preferably prohibited and the duration over which the above effects are preferably prohibited. The control system 500 may instead receive this information from the outside via the operating section 120 or a communication line, for example.

The lamps 182 indicate the state of the power supply to the corresponding test units 170. For example, when power is being supplied to a test unit 170, the corresponding lamp 182 lights up, and this light goes off when the supply of power to the test unit 170 is stopped. The power switches 184 switch whether the power supply to the corresponding test units 170 is ON or OFF.

The mode switches 186 switch the operation status of the corresponding test units 170. A user can use the mode switches 186 to select which test units 170 are exposed to the outside. The mode switches 186 may switch between a normal operation mode and a maintenance mode. Each mode switch 186 may be set to be unable to switch to the maintenance mode when power is being supplied to the corresponding test unit 170.

The type of the mode switches 186 is not particularly limited, and the mode switches 186 may each be a key switch including a cylinder lock and a key, for example. Furthermore, the cylinder lock in each key switch may be a type that prevents the key from being removed therefrom when in the locked state, and may be set such that the key cannot be removed unless the mode switch 186 selects the maintenance mode.

The mode switches 186 are examples of first selecting sections or second selecting sections. Instead of using the mode switches 186 to switch the operation states, the user may input to the operating section 120 a number of the test unit 170 that is to be exposed to the outside. In this case, the operating section 120 is also an example of a first selecting section.

Each locking section 196 locks the corresponding rear door 190 and maintenance cover 192. The type of the locking sections 196 is not particularly limited, and each locking section 196 may be a cylinder lock or the like that is mechanically opened and closed by a key, or an electronic lock or the like that is electrically opened and closed by a key. When using locking sections 196 that are mechanically opened and closed by keys, the same key may be used for the mode switch 186 and the locking section 196 corresponding to the same test unit 170.

In one embodiment, each locking section 196 may be set to release the lock on the corresponding rear door 190 and the maintenance cover 192 upon receiving notification from the control system 500 for allowing the test unit 170 contained in the housing chamber 172 to which this rear door 190 and maintenance cover 192 are provided, i.e. the corresponding test unit 170, to be exposed to the outside. In this case, if a locking section 196 does not receive the notification from the control system 500, the lock of the rear door 190 and the maintenance cover 192 cannot be released even if the user performs an unlocking operation.

For example, when the operation state of a test unit 170 is switched to the maintenance mode, the corresponding locking section 196 may receive the notification described above from the control system 500. In other words, when the test unit 170 selected by the mode switch 186 matches the test unit 170 selected by the locking section 196, the control system 500 allows the test unit 170 selected by the mode switch 186 to be exposed to the outside. As a result, the user can open the corresponding rear door 190 and maintenance cover 192 to exchange the probe card 300 or the pin electronics 210 of the test unit 170, or to perform other types of maintenance.

In this case, the user must reselect the test unit 170 to be exposed to the outside from among the plurality of test units 170. As a result, the user is prevented from mistakenly opening the wrong test unit 170 to the outside. The locking section 196 is an example of a first selecting section or a second selecting section.

In the above examples, when the test unit 170 selected by the first selecting section matches the test unit 170 selected by the second selecting section, the selected test unit 170 is exposed to the outside. In other words, the control system 500 performs a test method that includes a first selection whereby a user selects a test unit to be exposed to the outside from among the plurality of test units and a second selection whereby the user reselects a test unit to be exposed to the outside, wherein the test unit selected during the first selection is exposed to the outside if the test unit selected during the first selection matches the test unit selected during the second selection.

However, the operation performed when the selected test units 170 match is not limited to this. For example, when the selected test units 170 match, the supply of power to the selected test unit 170 may be stopped. In other words, the control system 500 may perform a test method that includes a first selection whereby a user selects a test unit to be exposed to the outside from among the plurality of test units, a second selection whereby the user reselects a test unit to be exposed to the outside, and the stoppage of the power supply to the test unit selected during the first selection if the test unit selected during the first selection matches the test unit selected during the second selection.

Furthermore, when a rear door 190 or a maintenance cover 192 of a housing chamber 172 exposes the test unit 170 stored in the housing chamber 172 to the outside while other test units 170 are attempting to perform a predetermined operation, the warning display section 198 may issue a warning to the user. The warning display section 198 may display information indicating that other test units 170 are attempting to perform the above operation. The warning display section 198 is an example of a warning section. Another example of the warning section is a speaker that emits a warning sound to the user in the above situation.

The predetermined operation may be an operation that is easily affected by mechanical vibration or a change in voltage, such as attaching a test head 200 to a probe card 300 or aligning the wafer 101 with the probe card 300. In this way, the user can be notified about the prohibition of operations that affect the prescribed operation while other test units 170 are performing this predetermined operation. Examples of operations that affect the predetermined operation include operations that cause mechanical vibration or a voltage change in the test unit 170, such as opening the corresponding rear door 190 and maintenance cover 192, exchanging the probe card 300 or the pin electronics 210 of the test unit 170, or other types of maintenance.

When the warning described above is issued, the predetermined process may be suspended until the user acknowledges the warning. The operation may then be started when the user operates the operating section 120 to input acknowledgment of the warning, or when the user stops performing maintenance, returns the rear door 190 and the maintenance cover 192 to their original states, and locks the locking section 196.

Figure 7:
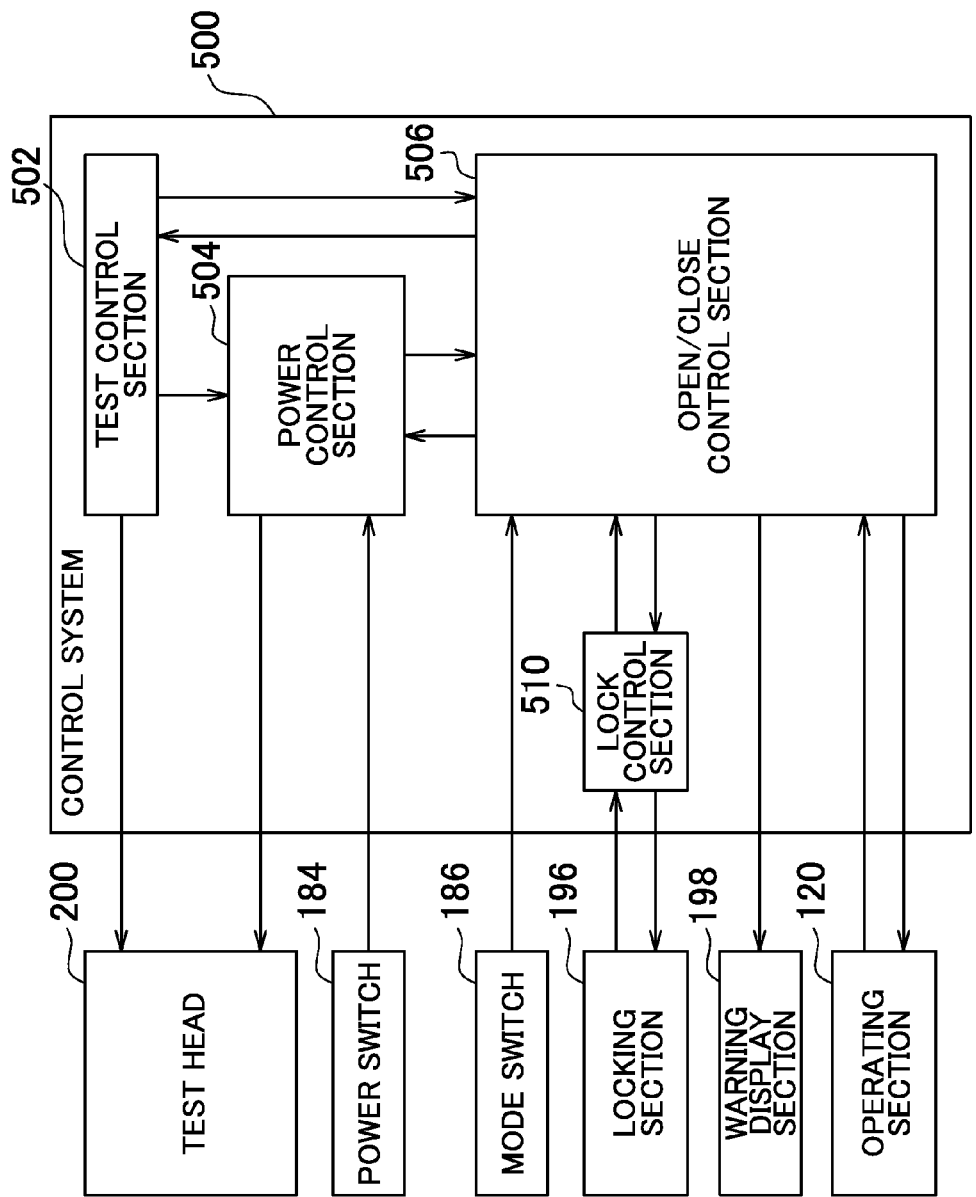
FIG. 7 shows an exemplary configuration of the control system 500.

FIG. 7 shows an exemplary configuration of the control system 500. The control system 500 includes a test control section 502, a power control section 504, an open/close control section 506, and a lock control section 510.

The test control section 502 is connected to the test head 200, the power control section 504, and the open/close control section 506. The test control section 502 receives from the open/close control section 506 information concerning whether the locking section 196 is locked, and also receives the information that the open/close control section 506 receives from the operating section 120.

The test control section 502 may store a test program. The test control section 502 may store information relating to the prescribed period and to the types of operations for which prohibition of the opening of other test units 170 to the outside is preferable, during a period when the predetermined operation is being performed and during a prescribed period before or after this period. These operations are referred to hereinafter as opening-prohibited operations, and this information is referred to hereinafter as information concerning opening-prohibited operations. The test control section 502 may store the test program and the information concerning opening-prohibited operations in advance, or may receive the test program and the information concerning opening-prohibited operations from the outside via a communication line, storage medium, or the like.

The test control section 502 controls the operation of the test head 200 based on the information received from the open/close control section 506, the test program, and the information concerning opening-prohibited operations. For example, the test control section 502 may reference the test program and, if the next operation is an opening-prohibited operation, suspend execution of this operation until locking of the locking section 196 is confirmed.

The test control section 502 provides the power control section 504 and the open/close control section 506 with information concerning the state of the testing. For example, the test control section 502 may provide notification that the current operation is an opening-prohibited operation or that the next operation is an opening-prohibited operation.

The power control section 504 is connected to the test head 200, the power switch 184, the test control section 502, and the open/close control section 506. The power control section 504 receives from the power switch 184 information concerning the starting and stopping of the corresponding test unit 170. The power control section 504 receives from the test control section 502 information concerning the state of the testing. The power control section 504 receives from the open/close control section 506 information concerning test units 170 whose power supplies are to be stopped.

The power control section 504 stops the supply of power to the appropriate test heads 200 based on the received information. For example, the power control section 504 may reference the information received from the power switch 184 and the information received from the test control section 502 to judge whether it is acceptable to stop the supply of power to a test unit 170 whose power supply is to be stopped according to the information received from the open/close control section 506. The power control section 504 then suspends the power supply stoppage until a state is reached where power supply stoppage is acceptable. The power control section 504 provides the open/close control section 506 with information concerning the state of the power supply to each test head 200.

The open/close control section 506 is connected to the mode switch 186, the lock control section 510, the operating section 120, the test control section 502, and the power control section 504. The open/close control section 506 receives from the mode switch 186 information concerning the operation status of the corresponding test unit 170. The open/close control section 506 receives from the lock control section 510 information concerning whether the locking section 196 is locked. The open/close control section 506 receives from the operating section 120 information concerning input by the user. The open/close control section 506 receives from the test control section 502 information concerning the state of the testing. The open/close control section 506 receives from the power control section 504 information concerning the state of the power supply to each test head 200.

The open/close control section 506 judges whether the locking of the locking section 196 corresponding to each test unit 170 is released, based on the received information. In other words, the open/close control section 506 judges whether each test unit 170 can be exposed to the outside. The open/close control section 506 judges whether it is acceptable to stop the supply of power to each test unit 170. The open/close control section 506 judges whether each warning display section 198 issues a warning when the corresponding locking section 196 is unlocked.

In one embodiment, the open/close control section 506 receives from the mode switch 186 notification concerning the switching of the operation status of the corresponding test unit 170 to the maintenance mode. In this state, when the open/close control section 506 receives from the lock control section 510 an inquiry as to whether the corresponding test unit 170 can be unlocked, the open/close control section 506 judges whether the test unit 170 corresponding to the mode switch 186 matches the test unit 170 corresponding to the lock control section 510. If there is a match, the open/close control section 506 notifies the lock control section 510 that this test unit 170 can be unlocked.

In another embodiment, the open/close control section 506 receives from the lock control section 510 notification that a corresponding test unit 170 has been selected. In this state, when the open/close control section 506 receives from the mode switch 186 notification that the operation status of the corresponding test unit 170 is switched to the maintenance mode, the open/close control section 506 judges whether the test unit 170 corresponding to the mode switch 186 matches the test unit 170 corresponding to the lock control section 510. If there is a match, the open/close control section 506 notifies the power control section 504 that the supply of power to this test unit 170 should be stopped.

The open/close control section 506 notifies the test control section 502, the power control section 504, and the lock control section 510 concerning the results of the above judgments. The open/close control section 506 notifies the operating section 120 concerning the locking status of the locking section 196, the progress of the testing, or the like. If necessary, the open/close control section 506 also issues a warning to the warning display section 198.

The lock control section 510 is connected to the locking section 196 and the open/close control section 506. The lock control section 510 may judge whether a locking section 196 is selected by detecting the locking state of the locking section 196. The lock control section 510 is an example of a first selecting section or a second selecting section.

The lock control section 510 receives an inquiry from the locking section 196 as to whether unlocking is acceptable. The lock control section 510 receives information from the open/close control section 506 concerning whether unlocking is acceptable. The lock control section 510 unlocks the locking section 196 if information indicating that unlocking is acceptable is received from the open/close control section 506 and an inquiry is received from the locking section 196 as to whether unlocking is acceptable. If information indicating that unlocking is acceptable is not received from the open/close control section 506, the lock control section 510 does not unlock the locking section 196 even if an inquiry is received from the locking section 196 as to whether unlocking is acceptable.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus comprising:
a plurality of test units that test a device under test;
a plurality of housing sections that respectively house the test units therein;
a plurality of opening/closing sections that are disposed respectively in the housing sections and that expose the test units to an outside of the respective housing section or isolate the test units from the outside;
a control section that independently controls whether each of the opening/closing sections is allowed to be opened, wherein
for at least one of (i) a period during which one of the test units is performing a predetermined operation, (ii) a predetermined period before the period during which one of the test units is performing the predetermined operation, and (iii) a predetermined period after the period during which one of the test units is performing the predetermined operation, the control section prohibits other test units from being exposed to the outside.

2. The test apparatus according to claim 1, wherein the control section allows test units that are not supplied with power to be exposed to the outside.

3. The test apparatus according to claim 1, wherein the predetermined operation is an operation that causes (i) a test head that tests an electrical characteristic of the device under test to contact (ii) a probe card that is interposed between the test head and the device under test and that is electrically connected to the device under test and the test head.

4. The test apparatus according to claim 1, further comprising:
a chassis that houses the test units therein; and
a partitioning member that forms the plurality of housing sections by dividing the chassis.

5. The test apparatus according to claim 1, wherein each of the housing sections includes a temperature adjusting section that operates independently.

6. A test apparatus comprising:
a plurality of test units that test a device under test;
a plurality of housing sections that respectively house the test units therein;
a plurality of opening/closing sections that are disposed respectively in the housing sections and that expose the test units to an outside of the respective housing section or isolate the test units from the outside; and a control section that independently controls whether each of the opening/closing sections is allowed to be opened, wherein when one of the opening/closing sections exposes a corresponding test unit to the outside while one of the test units is attempting to perform a predetermined operation, the control section prohibits performance of the predetermined operation or a warning section of the test apparatus issues a warning.

7. The test apparatus according to claim 6, wherein when one of the opening/closing sections exposes a corresponding test unit to the outside while one of the test units is attempting to perform a predetermined operation, the control section prohibits performance of the predetermined operation.

8. The test apparatus according to claim 6, further comprising a warning section that issues a warning when one of the opening/closing sections exposes a corresponding test unit to the outside while one of the test units is attempting to perform a predetermined operation.

9. The test apparatus according to claim 6, wherein the control section allows test units that are not supplied with power to be exposed to the outside.

10. The test apparatus according to claim 6, further comprising:

a chassis that houses the test units therein; and a partitioning member that forms the plurality of housing sections by dividing the chassis.

11. The test apparatus according to claim 6, wherein each of the housing sections includes a temperature adjusting section that operates independently.

12. A test apparatus comprising:

a plurality of test units that test a device under test;

a plurality of housing sections that respectively house the test units therein;

a plurality of opening/closing sections that are disposed respectively in the housing sections and that expose the test units to an outside of the respective housing section or isolate the test units from the outside;

a control section that independently controls whether each of the opening/closing sections is allowed to be opened;

a first selecting section that enables selection of one of the plurality of test units to be exposed to the outside; and a second selecting section that enables reselection of the one of the plurality of test units to be exposed to the outside, wherein if the test unit selected via the first selecting section matches the test unit selected via the second selecting section, the control section allows the test unit selected via the first selecting section to be exposed to the outside or stops a supply of power to the test unit selected via the first selecting section.

13. The test apparatus according to claim 12, wherein the control section allows the test unit selected via the first selecting section to be exposed to the outside if the test unit selected via the first selecting section matches the test unit selected via the second selecting section.

14. The test apparatus according to claim 12, wherein the control section stops a supply of power to the test unit selected via the first selecting section if the test unit selected via the first selecting section matches the test unit selected via the second selecting section.

15. The test apparatus according to claim 12, wherein the control section allows test units that are not supplied with power to be exposed to the outside.

16. The test apparatus according to claim 12, further comprising:

a chassis that houses the test units therein; and a partitioning member that forms the plurality of housing sections by dividing the chassis.

17. The test apparatus according to claim 12, wherein each of the housing sections includes a temperature adjusting section that operates independently.

18. A test method comprising:

first selecting whereby a test unit, from among a plurality of test units that test a device under test, is selected to be exposed to an outside of a housing section of the test unit;

second selecting whereby the test unit is reselected to be exposed to the outside; and if the test unit selected during the first selection matches the test unit selected during the second selection, judging that the test unit selected during the first selection is to be exposed to the outside or stopping a supply of power to the test unit selected during the first selection; and if it is judged that the test unit selected during the first selection is to be exposed to the outside, allowing the test unit selected during the first selection to be exposed to the outside.

19. The test method according to claim 18, further comprising:

judging that the test unit selected during the first selection is to be exposed to the outside if the test unit selected during the first selection matches the test unit selected during the second selection.

20. The test method according to claim 18, further comprising:

stopping a supply of power to the test unit selected during the first selection if the test unit selected during the first selection matches the test unit selected during the second selection.

* * * * *